(12) United States Patent
Wang et al.

(10) Patent No.: US 12,538,643 B2
(45) Date of Patent: Jan. 27, 2026

(54) LIGHT-EMITTING DEVICE, CONTROL METHOD THEREFOR, AND LIGHT-EMITTING SUBSTRATE

(71) Applicant: BOE Technology Group Co., Ltd., Beijing (CN)

(72) Inventors: Peng Wang, Beijing (CN); Xiaohu Li, Beijing (CN); Juan Zhang, Beijing (CN); Zhiqiang Jiao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 391 days.

(21) Appl. No.: 18/270,975

(22) PCT Filed: Sep. 21, 2022

(86) PCT No.: PCT/CN2022/120274
§ 371 (c)(1),
(2) Date: Jul. 5, 2023

(87) PCT Pub. No.: WO2023/077987
PCT Pub. Date: May 11, 2023

(65) Prior Publication Data
US 2024/0306418 A1    Sep. 12, 2024

(30) Foreign Application Priority Data
Nov. 3, 2021  (CN) .......................... 202111281115.9

(51) Int. Cl.
*H10K 50/30* (2023.01)
*H10K 50/11* (2023.01)
(Continued)

(52) U.S. Cl.
CPC ............. *H10K 50/30* (2023.02); *H10K 50/11* (2023.02); *H10K 50/16* (2023.02); *H10K 50/805* (2023.02); *H10K 85/6572* (2023.02)

(58) Field of Classification Search
CPC ........ H10K 50/30; H10K 50/11; H10K 50/16; H10K 50/805; H10K 85/6572;
(Continued)

(56) References Cited

U.S. PATENT DOCUMENTS

| 9,269,750 B2 * | 2/2016 | Kim ...................... H10K 50/16 |
| 2009/0008628 A1 * | 1/2009 | Choi .................... H10K 59/805 |
| | | 257/E29.094 |

(Continued)

FOREIGN PATENT DOCUMENTS

| CN | 103219463 A | 7/2013 |
| CN | 103782408 A | 5/2014 |

(Continued)

*Primary Examiner* — S M Sohel Imtiaz
(74) *Attorney, Agent, or Firm* — WHDA, LLP

(57) ABSTRACT

A light emitting device includes: a first electrode layer, a first dielectric layer, a first luminescent layer, a second luminescent layer, a second dielectric layer and a second electrode layer that are arranged sequentially in stack; a source electrode and a drain electrode, wherein the source electrode and the drain electrode are arranged in a same layer, and are both located between the first luminescent layer and the second luminescent layer; and an insulating layer provided in the same layer as the source electrode and the drain electrode, and located between the source electrode and the drain electrode. By controlling the two electrode layers separately, the two luminescent layers may separately and independently emit light. By providing different materials of the luminescent layers, the effect of light emission of multiple mixed colors or the effect of an increased light intensity may be realized.

20 Claims, 4 Drawing Sheets

(51) Int. Cl.
*H10K 50/16* (2023.01)
*H10K 50/805* (2023.01)
*H10K 85/60* (2023.01)

(58) Field of Classification Search
CPC ........ H10K 50/00; H10K 50/13; H10K 59/00; H10K 59/10; H10D 86/00
See application file for complete search history.

(56) References Cited

U.S. PATENT DOCUMENTS

| | | | | |
|---|---|---|---|---|
| 2014/0054613 | A1* | 2/2014 | Facchetti | H10K 50/16 |
| | | | | 257/79 |
| 2014/0299852 | A1* | 10/2014 | Hong | H10K 50/30 |
| | | | | 257/40 |
| 2015/0357604 | A1* | 12/2015 | Muccini | H10K 10/482 |
| | | | | 257/40 |
| 2018/0331130 | A1 | 11/2018 | Sun et al. | |
| 2019/0229017 | A1* | 7/2019 | Liu | H01L 21/77 |
| 2022/0376001 | A1 | 11/2022 | Wu et al. | |
| 2025/0204251 | A1* | 6/2025 | Song | H10K 85/657 |

FOREIGN PATENT DOCUMENTS

| | | | | |
|---|---|---|---|---|
| CN | 108288678 | A * | 7/2018 | ........... H10K 50/131 |
| CN | 111785744 | A | 10/2020 | |

* cited by examiner

LIGHT-EMITTING DEVICE, CONTROL METHOD THEREFOR, AND LIGHT-EMITTING SUBSTRATE

CROSS REFERENCE TO RELEVANT APPLICATIONS

The present application claims the priority of the Chinese patent application filed on Nov. 3, 2021 before the Chinese Patent Office with the application number of 202111281115.9 and the title of "LIGHT-EMITTING DEVICE, CONTROL METHOD THEREFOR, AND LIGHT-EMITTING SUBSTRATE", which is incorporated herein in its entirety by reference.

TECHNICAL FIELD

The present application relates to the technical field of displaying, and particularly relates to a light emitting device and a controlling method thereof, and a light emitting substrate.

BACKGROUND

An organic light emitting transistor (OLET) integrates a thin-film transistor (TFT) and an organic light emitting diode (OLED). It regulates the electric current by using the grid voltage of the TFT, to further control the light emission of the OLED.

SUMMARY

The embodiments of the present application employ the following technical solutions:
in the first aspect, an embodiment of the present application provides a light emitting device, wherein the light emitting device comprises:
  a first electrode layer, a first dielectric layer, a first luminescent layer, a second luminescent layer, a second dielectric layer and a second electrode layer that are arranged sequentially in stack;
  a source electrode and a drain electrode, wherein the source electrode and the drain electrode are arranged in a same layer, and are both located between the first luminescent layer and the second luminescent layer; and
  an insulating layer provided in the same layer as the source electrode and the drain electrode, and located between the source electrode and the drain electrode.
In some embodiments of the present application, the light emitting device further comprises a first charge-carrier transporting layer and a second charge-carrier transporting layer;
  the first charge-carrier transporting layer is located on one side of the first luminescent layer that is away from the first electrode layer; and
  the second charge-carrier transporting layer is located between the second luminescent layer and the first luminescent layer, and located on one side of the insulating layer that is away from the first luminescent layer.
In some embodiments of the present application, both of the first charge-carrier transporting layer and the second charge-carrier transporting layer are an electron transporting layer.
In some embodiments of the present application, both of the first charge-carrier transporting layer and the second charge-carrier transporting layer are a hole transporting layer.

In some embodiments of the present application, one of the first charge-carrier transporting layer and the second charge-carrier transporting layer is an electron transporting layer, and the other is a hole transporting layer.

In some embodiments of the present application, the first electrode layer and the second electrode layer are configured to receive electric signals of same polarities, and the first luminescent layer and the second luminescent layer are configured to emit light at the same time.

In some embodiments of the present application, the first electrode layer and the second electrode layer are electrically connected; and
  the first electrode layer and the second electrode layer are configured to receive a same electric signal.

In some embodiments of the present application, the first electrode layer and the second electrode layer are configured to receive electric signals of opposite polarities, and the first luminescent layer and the second luminescent layer are configured to emit light at the same time.

In some embodiments of the present application, the first electrode layer and the second electrode layer are electrically connected; and
  the first electrode layer and the second electrode layer are configured to receive a same electric signal and alternately emit light.

In some embodiments of the present application, all of surfaces of the source electrode, the drain electrode and the insulating layer that are away from the first electrode layer are located in a same plane.

In some embodiments of the present application, a material of the insulating layer is a light-transmitting insulating material.

In some embodiments of the present application, the light-transmitting insulating material comprises any one of or a combination of some of lithium fluoride, zinc oxide and 4,4'-di(9-carbazolyl)biphenyl.

In the second aspect, an embodiment of the present application provides a light emitting substrate, wherein the light emitting substrate comprises a plurality of the light emitting devices stated above.

In some embodiments of the present application, the light emitting substrate is a backlight substrate; and
  both of an emitted-light color of the first luminescent layer of the light emitting device and an emitted-light color of the second luminescent layer of the light emitting device are a blue color; or
  an emitted-light color of one of the first luminescent layer and the second luminescent layer is a yellow color, and an emitted-light color of the other of the first luminescent layer and the second luminescent layer is a blue color.

In some embodiments of the present application, the light emitting substrate is a displaying substrate;
  the light emitting substrate comprises a plurality of light-emitting-device groups that are arranged in array, and each of the light-emitting-device groups comprises a plurality of light emitting devices with different emitted-light colors; and
  emitted-light colors of the first luminescent layer and the second luminescent layer of a same light emitting device are the same.

In the third aspect, an embodiment of the present application provides a controlling method of a light emitting device, wherein the controlling method comprises:
  supplying a first voltage signal to the source electrode of the light emitting device;

supplying a second voltage signal to the drain electrode of the light emitting device;

supplying a third voltage signal to the first electrode layer of the light emitting device, wherein the third voltage signal is configured to control the first luminescent layer of the light emitting device to emit light; and supplying a fourth voltage signal to the second electrode layer of the light emitting device, wherein the fourth voltage signal is configured to control the second luminescent layer of the light emitting device to emit light, wherein the first luminescent layer and the second luminescent layer are configured to be capable of emitting light at the same time or be capable of alternately emitting light.

The above description is merely a summary of the technical solutions of the present application. In order to more clearly know the elements of the present application to enable the implementation according to the contents of the description, and in order to make the above and other purposes, features and advantages of the present application more apparent and understandable, the particular embodiments of the present application are provided below.

BRIEF DESCRIPTION OF THE DRAWINGS

In order to more clearly illustrate the technical solutions of the embodiments of the present application or the related art, the figures that are required to describe the embodiments or the related art will be briefly described below. Apparently, the figures that are described below are merely embodiments of the present application, and a person skilled in the art can obtain other figures according to these figures without paying creative work.

FIG. 1 to FIG. 3a are schematic structural diagrams of seven different light emitting devices according to the embodiments of the present application;

FIG. 3b is a sequence chart of the controlling on the light emitting device shown in FIG. 3a;

DETAILED DESCRIPTION

The technical solutions of the embodiments of the present application will be clearly and completely described below with reference to the drawings of the embodiments of the present application. Apparently, the described embodiments are merely certain embodiments of the present application, rather than all of the embodiments. All of the other embodiments that a person skilled in the art obtains on the basis of the embodiments of the present application without paying creative work fall within the protection scope of the present application.

Unless stated otherwise in the context, throughout the description and the claims, the term "comprise" is interpreted as the meaning of opened containing, i.e., "including but not limited to". In the description of the present disclosure, the terms "one embodiment", "some embodiments", "exemplary embodiments", "example", "specific example" or "some examples" are intended to indicate that specific features, structures, materials or characteristics related to the embodiment or example are comprised in at least one embodiment or example of the present application. The illustrative indication of the above terms does not necessarily refer to the same embodiment or example. Moreover, the specific features, structures, materials or characteristics may be comprised in any one or more embodiments or examples in any suitable manner.

In the embodiments of the present application, terms such as "first" and "second" are used to distinguish identical items or similar items that have substantially the same functions and effects, merely in order to clearly describe the technical solutions of the embodiments of the present application, and should not be construed as indicating or implying the degrees of importance or implicitly indicating the quantity of the specified technical features.

With the rapid development of the technique of displaying, the Organic Light Emitting Diode (OLED) displaying technique, because of its advantages such as a low driving voltage, self-illumination, a wide visual angle, a high resolution and quick response, has attracted much attention and study. In OLED display products, thin-film transistors (TFT) are the switches for controlling the OLED pixel units, serve to control the on-off state of the OLED pixel units and regulate the magnitudes of the electric currents passing through the OLED pixel units, and are an important component of the pixel driving circuits of the OLED display products.

In the related art, in order to reduce the complexity of the pixel driving circuits in the OLED display products, reduce the quantity of the thin-film transistors, and increase the pixel density, a thin-film transistor and an organic light emitting diode are integrated together, to obtain an organic light emitting transistor. However, it is difficult to increase the emitted-light brightness and the luminous efficiency of the current organic light emitting transistor devices.

Figure 1:
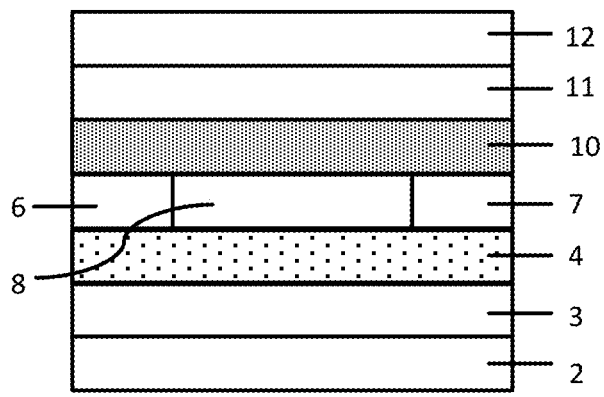

An embodiment of the present application provides a light emitting device. Referring to FIG. 1, the light emitting device comprises:

a first electrode layer 2, a first dielectric layer 3, a first luminescent layer 4, a second luminescent layer 10, a second dielectric layer 11 and a second electrode layer 12 that are arranged sequentially in stack;

a source electrode 6 and a drain electrode 7, wherein the source electrode 6 and the drain electrode 7 are arranged in the same layer, and are both located between the first luminescent layer 4 and the second luminescent layer 10; and an insulating layer 8 provided in the same layer as the source electrode 6 and the drain electrode 7, and located between the source electrode 6 and the drain electrode 7.

In an exemplary embodiment, both of the first electrode layer 2 and the second electrode layer 12 are a grid layer.

By the joint effect of the grid voltage and the source-drain voltage provided by the first electrode layer 2 and the second electrode layer 12, electrically conducting channels are formed at the interfaces between the luminescent layers and the dielectric layers (the interface between the first luminescent layer 4 and the first dielectric layer 3, and the interface between the second luminescent layer 10 and the second dielectric layer 11), and a channel current is formed by the effect of the source electrode 6 and the drain electrode 7, which makes the source electrode 6 and the drain electrode 7 conduction. Additionally, by the controlling by the first electrode layer 2, holes and electrons are injected into the first luminescent layer 4 from the source electrode 6 and the drain electrode 7 respectively, and by the controlling by the second electrode layer 12, holes and electrons are injected into the second luminescent layer 10 from the source electrode 6 and the drain electrode 7 respectively. The holes and the electrons encounter in the luminescent layers (the first luminescent layer 4 and the second luminescent layer 10) to form excitons, and subsequently some of the excitons recombine, to have radioluminescence near the electrically conducting channels.

In an exemplary embodiment, both of the materials of the first electrode layer 2 and the second electrode layer 12 may be a light-transmitting material, for example, indium tin oxide (ITO).

In an exemplary embodiment, the material of the first electrode layer 2 is a light-transmitting electrically conductive material, for example, indium tin oxide (ITO). The material of the second electrode layer 12 is a metal, for example, any one of or a combination of some of gold, silver, aluminum and magnesium.

In an exemplary embodiment, the first dielectric layer 3 and the second dielectric layer 11 serve as a grid insulating layer.

As an example, the materials of the first dielectric layer 3 and the second dielectric layer 11 may be one of or a combination of some of zinc oxide ($Al_2O_3$), silicon nitride (SiNx), silicon oxide ($SiO_2$), polymethyl methacrylate (PMMA) and polyvinyl alcohol (PVA).

As an example, the first dielectric layer 3 and the second dielectric layer 11 may be of a single-film-layer structure comprising one insulating material, and may also be a tandem structure comprising at least two insulating materials.

As an example, the materials and the structures of the first dielectric layer 3 and the second dielectric layer 11 may be the same.

In an exemplary embodiment, the materials of the source electrode 6 and the drain electrode 7 may be one of or a combination of some of gold, silver, copper, aluminum and magnesium.

As an example, if the materials of the source electrode 6 and the drain electrode 7 are a combination of multiple metals, they may be of, for example, a copper/aluminum tandem structure, and may also be of a single-film-layer structure of a copper-aluminum alloy.

In an exemplary embodiment, comprehensively taking into consideration the factors of the work function, the electric conductivity and the light transmittance, the materials of the source electrode 6 and the drain electrode 7 are configured to be gold.

As an example, the thicknesses of the source electrode 6 and the drain electrode 7 in the direction perpendicular to the luminescent layers (the first luminescent layer 4 or the second luminescent layer 10) are equal, and both of the ranges of the thicknesses are 60 Å-100 Å, for example, 75 Å, 80 Å, 85 Å or 90 Å.

In an exemplary embodiment, the light-emission directions of the first luminescent layer 4 and the second luminescent layer 10 in the light emitting device are the same. Alternatively, the light-emission directions of the first luminescent layer 4 and the second luminescent layer 10 in the light emitting device are opposite.

As an example, if the light-emission directions of the first luminescent layer 4 and the second luminescent layer 10 in the light emitting device are the same, all of the materials of the film layers in the light-emission path are a light-transmitting material.

As an example, if the light-emission directions of the first luminescent layer 4 and the second luminescent layer 10 in the light emitting device are opposite, both of the materials of the first electrode layer 2 and the second electrode layer 12 are a light-transmitting material.

In some embodiments, if the light-emission directions of the first luminescent layer 4 and the second luminescent layer 10 in the light emitting device are the same, the light emitting device may be used as a backlight source or directly used for displaying.

Particularly, when the light emitting device is used as a backlight source, in a first case, the emitted-light colors of the first luminescent layer 4 and the second luminescent layer 10 may be the same, and both of the emitted-light colors are the blue color, to form a blue-color backlight source. In a second case, the emitted-light colors of the first luminescent layer 4 and the second luminescent layer 10 may be different; for example, the emitted-light color of one of them is the blue color, and the emitted-light color of the other is the yellow color, to form a white-color backlight source after light mixing.

When the light emitting device is directly used for displaying, one light emitting device serves as one sub-pixel of the displaying substrate, and the emitted-light colors of the first luminescent layer 4 and the second luminescent layer 10 of the same light emitting device are the same, to reach the effect of increasing the light intensity.

In an exemplary embodiment, both of the materials of the first luminescent layer 4 and the second luminescent layer 10 may be any one of $Alq_3$ (tri(8-hydroxyquinoline)aluminum), $Ir(ppy)_3$ (tri(2-phenylpyridine)iridium) and Firpic (bis(4,6-difluorophenylpyridine-N,C2)pyridine formyl iridium.

In an exemplary embodiment, the insulating layer 8 is provided in the same layer as the source electrode 6 and the drain electrode 7, and located between the source electrode 6 and the drain electrode 7, to be used as the insulating layer between the source electrode 6 and the drain electrode 7, to prevent contacting between the source electrode 6 and the drain electrode 7. The arrangement of the insulating layer 8, while ensuring that the two luminescent layers of the light emitting device separately and independently emit light, can simplify the structure of the light emitting device.

As an example, the material of the insulating layer 8 may be a light-transmitting insulating material. For example, the light-transmitting insulating material may comprise one of lithium fluoride (LiF, with a certain thickness, equivalent to the insulating layer), zinc oxide (ZnO) and 4,4'-di(9-carbazolyl)biphenyl.

As an example, the thickness of the insulating layer 8 in the direction perpendicular to the luminescent layers (the first luminescent layer 4 or the second luminescent layer 10) is equal to both of the thicknesses of the source electrode 6 and the drain electrode 7 in the direction perpendicular to the luminescent layers, and the ranges of the thicknesses are 60 Å-100 Å, for example, 75 Å, 80 Å, 85 Å or 90 Å.

In an exemplary embodiment, all of the source electrode 6, the drain electrode 7 and the insulating layer 8 may be fabricated by vacuum vapor deposition.

As compared with OLED light emitting devices in the related art, in the light emitting device according to the embodiments of the present application, the TFT and the OLED are integrated into one device, the grid voltage is used to control the light emitting current, to in turn control the luminous intensity, and the light emission and the controlling are integrated into one device, which increases the integration level of the device, simplifies the structure of the device, and increases the efficiency of the energy utilization. Additionally, because the carrier mobility of the light emitting transistor is greater than that of the organic light emitting diode, the probability of exciton quenching can be reduced, and by using the three electrodes, the source electrode 6, the drain electrode 7 and the grid layer (the first electrode layer 2 or the second electrode layer 12), the injection of the holes and the electrons may be controlled better, thereby increasing the luminous efficiency and the luminous intensity.

Additionally, in the embodiments of the present application, by providing the insulating layer 8 in the same layer as the source electrode 6 and the drain electrode 7, providing the insulating layer 8 between the source electrode 6 and the drain electrode 7, and subsequently providing the symmetrical luminescent layers, dielectric layers and electrode layers, as shown in FIG. 1, on the two sides of the source electrode and the drain electrode, a light emitting transistor of a double-electrode-layer and double-luminescent-layer structure is obtained. By controlling the two electrode layers (the first electrode layer 2 and the second electrode layer 12) separately, the two luminescent layers (the first luminescent layer 4 and the second luminescent layer 10) can separately and independently emit light, without converting the voltages of the source electrode and the drain electrode. By regulating the materials of the luminescent layers, the effect of light emission of multiple mixed colors or the effect of an increased light intensity of a single emitted-light color can be realized, which may solve the problem that organic light emitting transistor devices have a low brightness and it is difficult to realize a tandem structure.

Figure 2A:
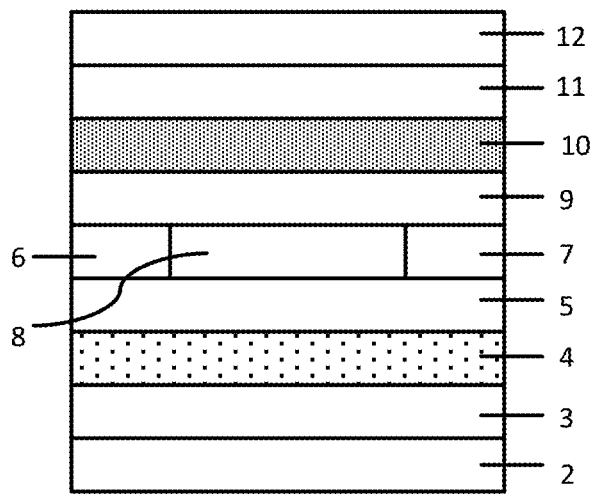

In some embodiments of the present application, referring to FIG. 2*a*, the light emitting device further comprises a first charge-carrier transporting layer 5 and a second charge-carrier transporting layer 9. The first charge-carrier transporting layer 5 is located on the side of the first luminescent layer 4 that is away from the first electrode layer 2. The second charge-carrier transporting layer 9 is located between the second luminescent layer 10 and the first luminescent layer 4, and located on the side of the insulating layer 8 that is away from the first luminescent layer 4.

Figure 2B:
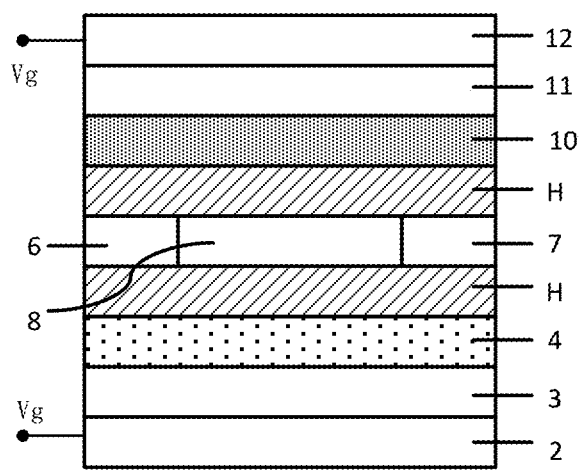
Figure 2C:
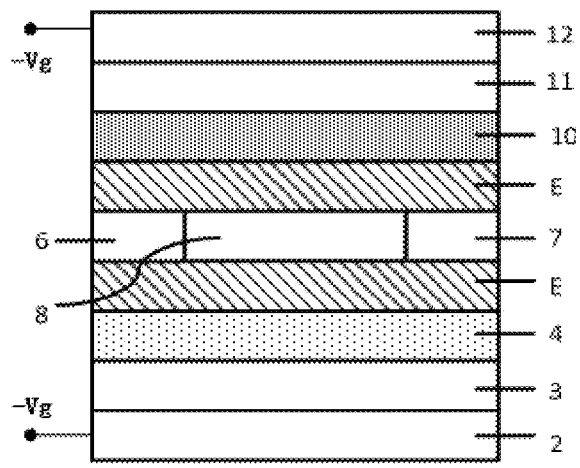

In some embodiments of the present application, referring to FIG. 2*b* or 2*c*, the types of the charge carriers transported by the first charge-carrier transporting layer 5 and the second charge-carrier transporting layer 9 are the same.

In an exemplary embodiment, referring to FIG. 2*c*, both of the first charge-carrier transporting layer 5 and the second charge-carrier transporting layer 9 may be used to transport electrons, in which case both of the first charge-carrier transporting layer 5 and the second charge-carrier transporting layer 9 are an electron transporting layer E.

As an example, the material of the electron transporting layer E may be at least one of NPB (N,N'-diphenyl-N,N'-(1-naphthyl)-1,1'-biphenyl-4,4'-diamine), Bphen (4,7-diphenyl-1,10-phenanthroline) and TPBi (1,3,5-tri(1-phenyl-1H-benzimidazol-2-yl)benzene).

Referring to FIG. 2*c*, because both of the first charge-carrier transporting layer 5 and the second charge-carrier transporting layer 9 are an electron transporting layer E, when the source electrode 6 is grounded, a voltage Vdata is applied to the drain electrode 7, and equal negative voltages −Vg are applied to the first electrode layer 2 and the second electrode layer 12, positive charges (the holes) accumulate near the interface between the first dielectric layer 3 and the first luminescent layer 4, and positive charges (the holes) accumulate near the interface between the second dielectric layer 11 and the second luminescent layer 10. With increasing of Vgs, the charge densities near the interfaces between the dielectric layers and the luminescent layers continuously increase, and when Vgs (the grid-source voltage) is greater than the threshold voltage of the transistor, two symmetrical electrically conducting channels are finally formed. After the electrically conducting channels are formed, the electrons and the holes injected by the source electrode 6 and the drain electrode 7 into the luminescent layers (the first luminescent layer 4 or the second luminescent layer 10) encounter in the luminescent layers to form excitons, and subsequently some of the excitons recombine, to have radioluminescence near the electrically conducting channels. It should be noted that, in practical applications, the voltages (Vg) applied to the two electrode layers may be regulated according to demands on the emitted-light brightness, and the magnitudes of the voltages of the two electrode layers may be equal, and may also be unequal.

In an exemplary embodiment, referring to FIG. 2*b*, both of the first charge-carrier transporting layer 5 and the second charge-carrier transporting layer 9 may be used to transport holes, in which case both of the first charge-carrier transporting layer 5 and the second charge-carrier transporting layer 9 are a hole transporting layer H.

As an example, the material of the hole transporting layer H may be at least one of CBP (4,4'-di(9-carbazolyl)biphenyl) and TAPC (4,4'-cyclohexyldi[N,N-di(4-methylphenyl)aniline]).

Referring to FIG. 2*b*, because both of the first charge-carrier transporting layer 5 and the second charge-carrier transporting layer 9 are a hole transporting layer H, when the source electrode 6 is grounded, a voltage Vdata is applied to the drain electrode 7, and equal positive voltages Vg are applied to the first electrode layer 2 and the second electrode layer 12, negative charges (the electrons) accumulate near the interface between the first dielectric layer 3 and the first luminescent layer 4, and negative charges (the electrons) accumulate near the interface between the second dielectric layer 11 and the second luminescent layer 10. With increasing of Vgs, the charge densities near the interfaces between the dielectric layers and the luminescent layers continuously increase, and when Vgs (the grid-source voltage) is greater than the threshold voltage of the transistor, two symmetrical electrically conducting channels are finally formed. After the electrically conducting channels are formed, the electrons and the holes injected by the source electrode 6 and the drain electrode 7 into the luminescent layers (the first luminescent layer 4 or the second luminescent layer 10) encounter in the luminescent layers to form excitons, and subsequently some of the excitons recombine, to have radioluminescence near the electrically conducting channels.

The light emitting device (light emitting transistor) of the symmetrical structure, as shown in FIG. 2*b* or 2*c*, according to the embodiments of the present application, when the luminescent materials of the first luminescent layer 4 and the second luminescent layer 10 are the same (or the emitted-light colors are the same) and the light-emission directions are the same, by the additive effects of the two luminescent layers, can increase the intensity of the emergent light of the light emitting device to a large extent.

It should be noted that, because the contact resistance between the first electrode layer 2 and the first dielectric layer 3 might be unequal to the contact resistance between the second electrode layer 12 and the second dielectric layer 11, the carrier migration rates of the two electrically conducting channels might be unequal. In practical applications, the luminous intensity of the first luminescent layer 4 may be controlled by regulating the magnitude of the voltage of the first electrode layer 2, and the luminous intensity of the second luminescent layer 10 may be controlled by regulating the magnitude of the voltage of the second electrode layer 12.

Figure 2D:
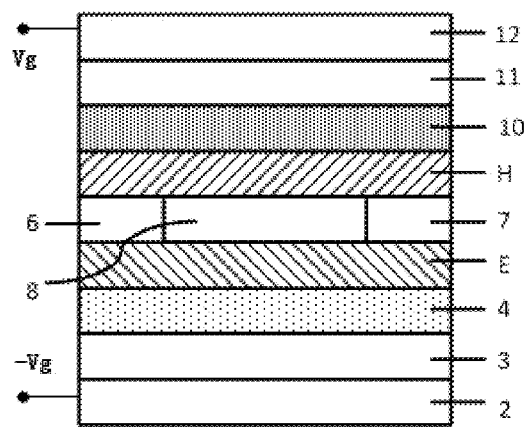
Figure 2E:
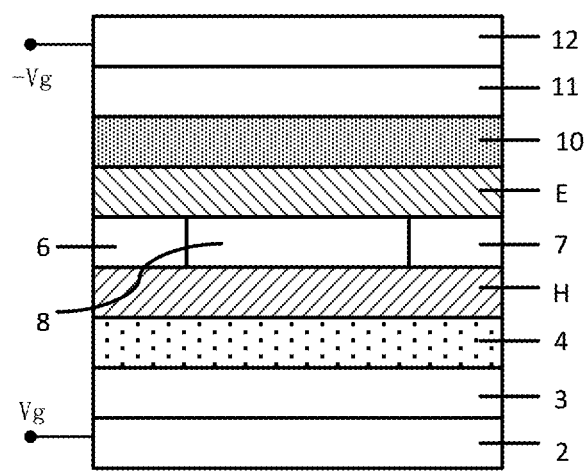

In some embodiments of the present application, referring to FIG. 2d or FIG. 2e, the types of the charge carriers transported by the first charge-carrier transporting layer 5 and the second charge-carrier transporting layer 9 are different.

In an exemplary embodiment, referring to FIG. 2d or FIG. 2e, one of the first charge-carrier transporting layer 5 and the second charge-carrier transporting layer 9 is an electron transporting layer E, and the other is a hole transporting layer H.

As an example, referring to FIG. 2e, the first charge-carrier transporting layer 5 is a hole transporting layer H, and the second charge-carrier transporting layer 9 is an electron transporting layer E. When the source electrode 6 is grounded, a voltage Vdata is applied to the drain electrode 7, a positive voltage Vg is applied to the first electrode layer 2, and a negative voltage −Vg is applied to the second electrode layer 12, negative charges (the electrons) accumulate near the interface between the first dielectric layer 3 and the first luminescent layer 4, and positive charges (the holes) accumulate near the interface between the second dielectric layer 11 and the second luminescent layer 10. With increasing of Vgs, the charge densities near the interfaces between the dielectric layers and the luminescent layers continuously increase, and when Vgs (the grid-source voltage) is greater than the threshold voltage (Vth) of the transistor, two electrically conducting channels are finally formed. After the electrically conducting channels are formed, the electrons and the holes injected by the source electrode 6 and the drain electrode 7 into the luminescent layers (the first luminescent layer 4 or the second luminescent layer 10) encounter in the luminescent layers to form excitons, and subsequently some of the excitons recombine, to have radioluminescence near the respective electrically conducting channels.

In an exemplary embodiment, if one of the first charge-carrier transporting layer 5 and the second charge-carrier transporting layer 9 is an electron transporting layer E, and the other is a hole transporting layer H, the light emitting device has bipolar electrically conducting channels (an electrically conducting channel formed by electron accumulation and an electrically conducting channel formed by hole accumulation), which, when the light emitting device is started up, can realize a more balanced transportation of the charge carriers, thereby increasing the working efficiency of the light emitting device.

Figure 3A:
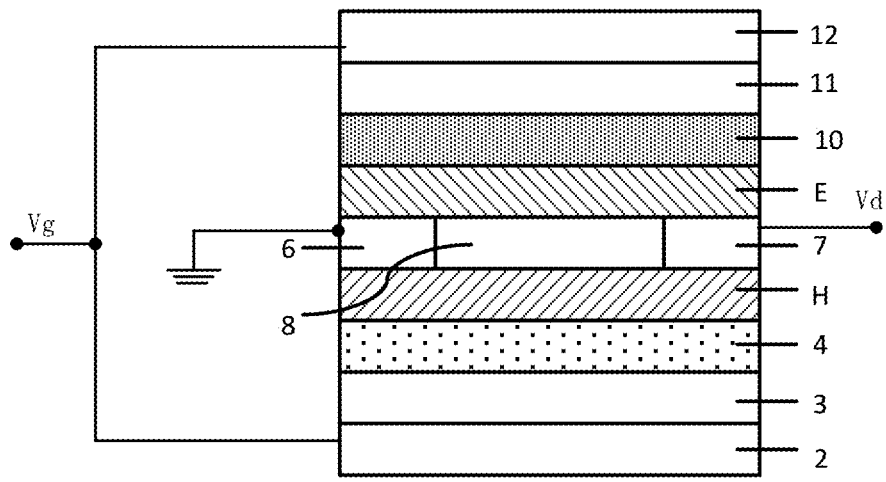
Figure 3B:
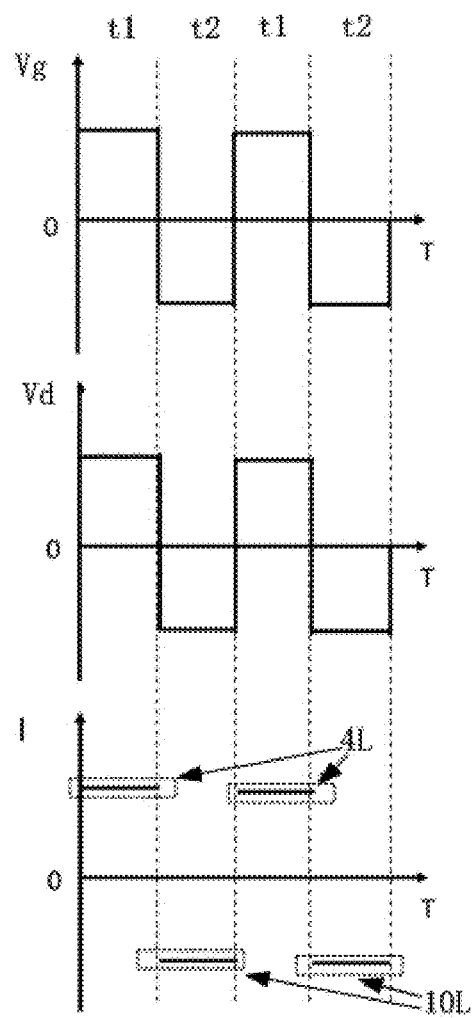

As an example, referring to FIG. 3a and FIG. 3b, the first charge-carrier transporting layer 5 is a hole transporting layer H, and the second charge-carrier transporting layer 9 is an electron transporting layer E. When the source electrode 6 is grounded, a voltage Vdata is applied to the drain electrode 7, and the same voltages that periodically vary are applied to the first electrode layer 2 and the second electrode layer 12, wherein FIG. 3b is a sequence chart of the voltage variation of Vg and Vd, the grid voltage Vg and the source-drain voltage Vd synchronously vary.

Figure 4A:
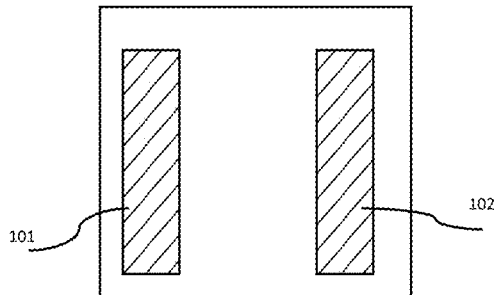
FIG. 4a is a schematic structural diagram of a mask for the source electrode and the drain electrode according to an embodiment of the present application.
Figure 4B:
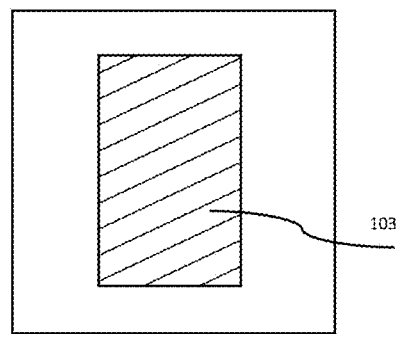
FIG. 4b is a schematic structural diagram of a mask for the insulating layer according to an embodiment of the present application.

At the stage t1, the grid voltage Vg and the source-drain voltage Vd synchronously operate within the positive-voltage time duration, and, when the grid-source voltage is greater than the threshold voltage of the transistor (Vgs>Vth), at the interface between the first luminescent layer 4 and the first grid dielectric layer 3 electrons accumulate and the electrically conducting channels are formed, and the first luminescent layer 4 emits light (marked as 4L in FIG. 4b). At this point, the grid-source voltage is the voltage between the first electrode layer 2 and the source electrode 6, and the threshold voltage of the transistor is the threshold voltage of the transistor formed by the first electrode layer 2 with the source electrode 6 and the drain electrode 7.

At the stage t2, the grid voltage Vg and the source-drain voltage Vd synchronously operate within the negative-voltage time duration, and, when the grid-source voltage is greater than the threshold voltage of the transistor (Vgs>Vth), at the interface between the second luminescent layer 10 and the second grid dielectric layer 11 holes accumulate and the electrically conducting channels are formed, and the second luminescent layer 10 emits light (marked as 10L in FIG. 4b). At this point, the grid-source voltage is the voltage between the second electrode layer and the source electrode, and the threshold voltage of the transistor is the threshold voltage of the transistor formed by the second electrode layer 12 with the source electrode 6 and the drain electrode 7.

Accordingly, by the controlling by the double grids of the first electrode layer 2 and the second electrode layer 12, time-division alternating light emission between the first luminescent layer 4 and the second luminescent layer 10 can be realized.

In an exemplary embodiment, the emitted-light color of the first luminescent layer 4 is the blue color, and the emitted-light color of the second luminescent layer 10 is the yellow color. Because, in practical applications, the alternating frequency of the time-division alternating light emission between the first luminescent layer 4 and the second luminescent layer 10 exceeds the range that human eyes can perceive, what human eyes perceive is the white light formed after the blue light emitted by the first luminescent layer 4 and the yellow light emitted by the second luminescent layer 10 are mixed, whereby the light emitting device can be used as a backlight. It should be noted that, by means of alternately emitting light by the two luminescent layers and then mixing into the white light, the wave bands of the light rays emitted by the two luminescent layers can be adjusted separately according to practical demands on the emitted-light wave band of the backlight source, to obtain an ideal backlight source.

In some embodiments of the present application, if the first charge-carrier transporting layer 5 and the second charge-carrier transporting layer 9 are both an electron transporting layer E or both a hole transporting layer H, the first electrode layer 2 and the second electrode layer 12 are configured to receive electric signals of the same polarities, and the first luminescent layer 4 and the second luminescent layer 10 are configured to emit light at the same time.

As an example, the first electrode layer 2 and the second electrode layer 12 may be electrically connected, whereby the first electrode layer 2 and the second electrode layer 12 receive the same electric signal.

As an example, if both of the first charge-carrier transporting layer 5 and the second charge-carrier transporting layer 9 are an electron transporting layer E, both of the first electrode layer 2 and the second electrode layer 12 are configured to receive a negative voltage, and at both of the interface between the first dielectric layer 3 and the first luminescent layer 4 and the interface between the second dielectric layer 11 and the second luminescent layer 10 positive charges (the holes) accumulate. With increasing of Vgs, the charge densities near the interfaces between the dielectric layers and the luminescent layers continuously increase, and when Vgs (the grid-source voltage) is greater than the threshold voltage of the transistor, two electrically conducting channels are finally formed. The excitons formed in the first luminescent layer 4 and the second luminescent layer 10 have radioluminescence near their respective corresponding electrically conducting channels.

As an example, if both of the first charge-carrier transporting layer 5 and the second charge-carrier transporting layer 9 are a hole transporting layer H, both of the first electrode layer 2 and the second electrode layer 12 are configured to receive a positive voltage, and at both of the interface between the first dielectric layer 3 and the first luminescent layer 4 and the interface between the second dielectric layer 11 and the second luminescent layer 10 negative charges (the electrons) accumulate. With increasing of Vgs, the charge densities near the interfaces between the dielectric layers and the luminescent layers continuously increase, and when Vgs (the grid-source voltage) is greater than the threshold voltage of the transistor, two electrically conducting channels are finally formed. The excitons formed in the first luminescent layer 4 and the second luminescent layer 10 have radioluminescence near their respective corresponding electrically conducting channels.

In some embodiments of the present application, if one of the first charge-carrier transporting layer 5 and the second charge-carrier transporting layer 9 is an electron transporting layer E, and the other is a hole transporting layer H, the first electrode layer 2 and the second electrode layer 12 are configured to receive electric signals of opposite polarities, and the first luminescent layer 4 and the second luminescent layer 10 are configured to emit light at the same time.

As an example, referring to FIG. 2e, the first charge-carrier transporting layer 5 is a hole transporting layer H, and the second charge-carrier transporting layer 9 is an electron transporting layer E. When a positive voltage Vg is applied to the first electrode layer 2, and a negative voltage -Vg is applied to the second electrode layer 12, near the interface between the first dielectric layer 3 and the first luminescent layer 4 negative charges (the electrons) accumulate, and near the interface between the second dielectric layer 11 and the second luminescent layer 10 positive charges (the holes) accumulate. With increasing of Vgs, the charge densities near the interfaces between the dielectric layers and the luminescent layers continuously increase, and when Vgs (the grid-source voltage) is greater than the threshold voltage (Vth) of the transistor, two electrically conducting channels are finally formed. After the electrically conducting channels are formed, the electrons and the holes injected by the source electrode 6 and the drain electrode 7 into the luminescent layers (the first luminescent layer 4 or the second luminescent layer 10) encounter in the luminescent layers to form excitons, and subsequently some of the excitons recombine, to simultaneously have radioluminescence near the respective electrically conducting channels.

In some embodiments of the present application, if one of the first charge-carrier transporting layer 5 and the second charge-carrier transporting layer 9 is an electron transporting layer E, and the other is a hole transporting layer H, as shown in FIG. 3a, the first electrode layer 2 and the second electrode layer 12 are electrically connected. The first electrode layer 2 and the second electrode layer 12 are configured to receive the same electric signal and alternately emit light.

As an example, the same electric signal received by the first electrode layer 2 and the second electrode layer 12 is a voltage signal that periodically varies, as shown in FIG. 3b.

Particularly, at the stage t1, the grid voltage Vg and the source-drain voltage Vd synchronously operate within the positive-voltage time duration, and, when the grid-source voltage is greater than the threshold voltage of the transistor (Vgs>Vth), at the interface between the first luminescent layer 4 and the first grid dielectric layer 3 electrons accumulate and the electrically conducting channels are formed, and the first luminescent layer 4 emits light (marked as 4L in FIG. 4b). At this point, the grid-source voltage is the voltage between the first electrode layer 2 and the source electrode 6, and the threshold voltage of the transistor is the threshold voltage of the transistor formed by the first electrode layer 2 with the source electrode 6 and the drain electrode 7.

At the stage t2, the grid voltage Vg and the source-drain voltage Vd synchronously operate within the negative-voltage time duration, and, when the grid-source voltage is greater than the threshold voltage of the transistor (Vgs>Vth), at the interface between the second luminescent layer 10 and the second grid dielectric layer 11 holes accumulate and the electrically conducting channels are formed, and the second luminescent layer 10 emits light (marked as 10L in FIG. 4b). At this point, the grid-source voltage is the voltage between the second electrode layer and the source electrode, and the threshold voltage of the transistor is the threshold voltage of the transistor formed by the second electrode layer 12 with the source electrode 6 and the drain electrode 7.

Accordingly, by the controlling by the double grids of the first electrode layer 2 and the second electrode layer 12, time-division alternating light emission between the first luminescent layer 4 and the second luminescent layer 10 can be realized.

In some embodiments of the present application, all of the surfaces of the source electrode 6, the drain electrode 7 and the insulating layer 8 that are away from the first electrode layer 2 are located in the same plane.

As an example, in practical applications, in order to ensure that the film layer of the second charge-carrier transporting layer 9 has good smoothness and continuity, the source electrode 6 and the drain electrode 7 are fabricated by using the mask shown in FIG. 4a, and the insulating layer 8 is fabricated by using the mask shown in FIG. 4b, whereby all of the surfaces of the source electrode 6, the drain electrode 7 and the insulating layer 8 that are away from the first electrode layer 2 are located in the same plane. The first opening region 101 shown in FIG. 4a corresponds to the source electrode 6, the second opening region 102 shown in FIG. 4a corresponds to the drain electrode 7, and the third opening region 103 shown in FIG. 4b corresponds to the insulating layer 8.

In some embodiments of the present application, the material of the insulating layer 8 is a light-transmitting insulating material.

In some embodiments of the present application, the light-transmitting insulating material comprises any one of or a combination of some of lithium fluoride, zinc oxide and 4,4'-di(9-carbazolyl)biphenyl.

An embodiment of the present application provides a light emitting substrate, wherein the light emitting substrate comprises a plurality of the light emitting devices stated above.

In some embodiments of the present application, the light emitting substrate is a backlight substrate.

In an exemplary embodiment, both of the emitted-light color of the first luminescent layer 4 of the light emitting device and the emitted-light color of the second luminescent layer 10 of the light emitting device are the blue color. In this case, by configuring the light-emission directions of the first luminescent layer 4 and the second luminescent layer 10 to be the same, and configuring the materials of the film layers in the light-emission path to be a light-transmitting material, by the additive effects of the two luminescent layers, the brightness of the light source of the backlight substrate can be increased to a large extent.

After a quantum-dot color converting layer is provided on the backlight substrate whose emitted-light color is the blue color, the displaying substrate can be formed.

In an exemplary embodiment, the emitted-light color of one of the first luminescent layer 4 and the second luminescent layer 10 is the yellow color, and the emitted-light color of the other is the blue color. In this case, by configuring the light-emission directions of the first luminescent layer 4 and the second luminescent layer 10 to be the same, and configuring the materials of the film layers in the light-emission path to be a light-transmitting material, after color mixing, the color of the light source of the backlight substrate is the white color.

After a color light filtering layer is provided on the backlight substrate whose emitted-light color is the white color, the displaying substrate can be formed.

In some embodiments of the present application, the light emitting substrate is a displaying substrate. The light emitting substrate comprises a plurality of light-emitting-device groups that are arranged in array, and each of the light-emitting-device groups comprises a plurality of light emitting devices having different emitted-light colors. The emitted-light colors of the first luminescent layer 4 and the second luminescent layer 10 of the same light emitting device are the same, and the light-emission directions of the two luminescent layers 4 are the same.

It should be noted that the light-emission directions of the first luminescent layer 4 and the second luminescent layer 10 may be the same, and the light-emission directions may also be different. All of the embodiments of the present application illustrate by taking the case as an example in which the light-emission directions of the first luminescent layer 4 and the second luminescent layer 10 are the same.

In the light emitting substrate according to the embodiments of the present application, by providing the insulating layer 8 in the same layer as the source electrode 6 and the drain electrode 7, providing the insulating layer 8 between the source electrode 6 and the drain electrode 7, and subsequently providing the symmetrical luminescent layers, dielectric layers and electrode layers, as shown in FIG. 1, on the two sides of the source electrode and the drain electrode, a light emitting transistor of a double-electrode-layer double-luminescent-layer structure is obtained. By controlling the two electrode layers (the first electrode layer 2 and the second electrode layer 12) separately, the two luminescent layers (the first luminescent layer 4 and the second luminescent layer 10) can separately and independently emit light. By providing different materials of the luminescent layers, the effect of light emission of multiple mixed colors or the effect of an increased light intensity can be realized.

Figure 5:
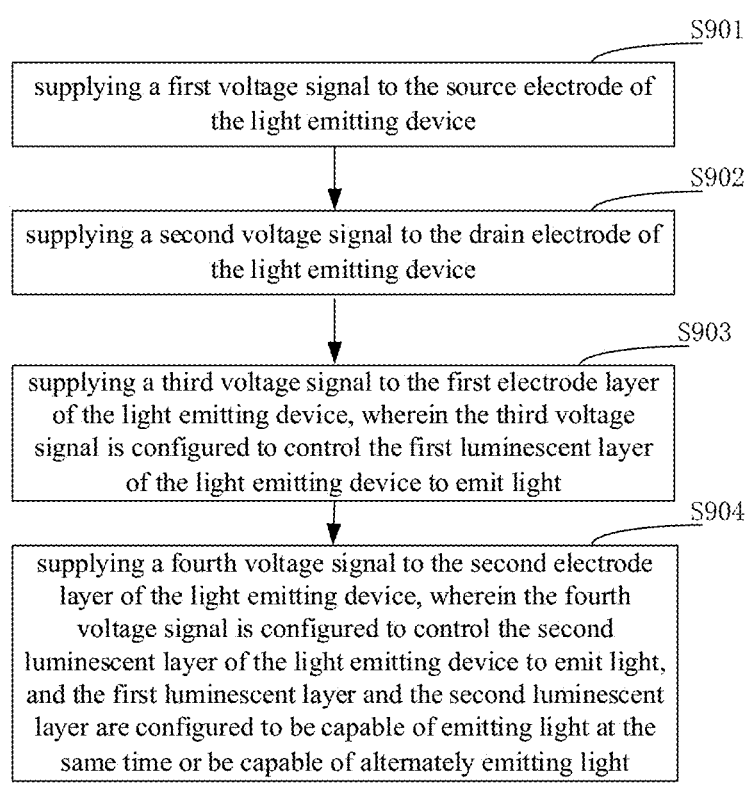
FIG. 5 is a flow chart of a controlling method of a light emitting device according to an embodiment of the present application.

An embodiment of the present application provides a controlling method of a light emitting device. Referring to FIG. 5, the controlling method comprises:

S901: supplying a first voltage signal to the source electrode 6 of the light emitting device.

As an example, the source electrode 6 of the light emitting device is grounded, whereby the first voltage signal Vs=0V.

S902: supplying a second voltage signal to the drain electrode 7 of the light emitting device.

As an example, the drain electrode 7 of the light emitting device may be electrically connected to a data signal line, to provide the second voltage signal Vd (Vdata) to the drain electrode 7.

S903: supplying a third voltage signal to the first electrode layer 2 of the light emitting device, wherein the third voltage signal is configured to control the first luminescent layer 4 of the light emitting device to emit light.

In an exemplary embodiment, by applying the third electric signal Vg1 to the first electrode layer 2, by the controlling by the third electric signal, when the grid-source voltage of the transistor formed by the first electrode layer 2, the source electrode 6 and the drain electrode 7 is greater than a threshold voltage of the transistor, the source electrode 6 and the drain electrode 7 of the transistor are switched on therebetween. The first luminescent layer 4 is between the first electrode layer 2 and the source/drain (6/7). By the controlling by the first electrode layer 2, the first luminescent layer 4 emits light, and by regulating the magnitude of the voltage of the first electrode layer 2, the luminous intensity of the first luminescent layer 4 can be regulated.

S904: supplying a fourth voltage signal to the second electrode layer 12 of the light emitting device, wherein the fourth voltage signal is configured to control the second luminescent layer 10 of the light emitting device to emit light, wherein the first luminescent layer and the second luminescent layer are configured to be capable of emitting light at the same time or be capable of alternately emitting light.

In an exemplary embodiment, by applying the fourth electric signal Vg2 to the second electrode layer 12, by the controlling by the fourth electric signal, when the grid-source voltage of the transistor formed by the second electrode layer 12, the source electrode 6 and the drain electrode 7 is greater than a threshold voltage of the transistor, the source electrode 6 and the drain electrode 7 of the transistor are switched on therebetween. The second luminescent layer 10 is between the second electrode layer 12 and the source/drain (6/7). By the controlling by the second electrode layer 12, the second luminescent layer 10 emits light, and by regulating the magnitude of the voltage of the second electrode layer 12, the luminous intensity of the second luminescent layer 10 can be regulated.

In an exemplary embodiment, the third voltage signal Vg1 and the fourth voltage signal Vg2 may have the same polarities, and may be the same electric signal having the same polarity and equal magnitude.

In an exemplary embodiment, the third voltage signal Vg1 and the fourth voltage signal Vg2 may have opposite polarities.

Particularly, the controlling method of a light emitting device will be described particularly with reference to the sequence chart shown in FIG. 3b by taking the structure of the light emitting device shown in FIG. 3a as an example.

S1: supplying a first voltage signal to the source electrode 6 of the light emitting device, wherein the source electrode 6 of the light emitting device is grounded, whereby the first voltage signal Vs=0V.

S2: supplying a second voltage signal to the drain electrode 7 of the light emitting device.

As an example, the drain electrode 7 of the light emitting device may be electrically connected to a data signal line, to provide the second voltage signal Vd (Vdata) to the drain electrode 7. The sequence chart of the second voltage signal Vd is shown in FIG. 3b.

S3: supplying a third voltage signal Vg to the first electrode layer 2 and the second electrode layer 12 of the light emitting device at the same time, wherein the third voltage signal Vg and the second voltage signal Vd have the same variation periods.

Referring to FIG. 4b, at the stage t1, the grid voltage Vg and the source-drain voltage Vd synchronously operate within the positive-voltage time duration, and, when the grid-source voltage is greater than the threshold voltage of the transistor (Vgs>Vth), at the interface between the first luminescent layer 4 and the first grid dielectric layer 3 electrons accumulate and the electrically conducting channels are formed, and the first luminescent layer 4 emits light (marked as 4L in FIG. 4b). At this point, the grid-source voltage is the voltage between the first electrode layer 2 and the source electrode 6, and the threshold voltage of the transistor is the threshold voltage of the transistor formed by the first electrode layer 2 with the source electrode 6 and the drain electrode 7.

At the stage t2, the grid voltage Vg and the source-drain voltage Vd synchronously operate within the negative-voltage time duration, and, when the grid-source voltage is greater than the threshold voltage of the transistor (Vgs>Vth), at the interface between the second luminescent layer 10 and the second grid dielectric layer 11 holes accumulate and the electrically conducting channels are formed, and the second luminescent layer 10 emits light (marked as 10L in FIG. 4b). At this point, the grid-source voltage is the voltage between the second electrode layer and the source electrode, and the threshold voltage of the transistor is the threshold voltage of the transistor formed by the second electrode layer 12 with the source electrode 6 and the drain electrode 7.

Accordingly, by the controlling by the double grids of the first electrode layer 2 and the second electrode layer 12, time-division alternating light emission between the first luminescent layer 4 and the second luminescent layer 10 can be realized.

When the light emitting device has different particular structures, its controlling methods are also different, which may particularly refer to the above explanation on the operating principle of the light emitting devices of different structures, and is not discussed further herein.

The above are merely particular embodiments of the present application, and the protection scope of the present application is not limited thereto. All of the variations or substitutions that a person skilled in the art can easily envisage within the technical scope disclosed by the present application should fall within the protection scope of the present application. Therefore, the protection scope of the present application should be subject to the protection scope of the claims.

The invention claimed is:

1. A light emitting device, wherein the light emitting device comprises:
   a first electrode layer, a first dielectric layer, a first luminescent layer, a second luminescent layer, a second dielectric layer and a second electrode layer that are arranged sequentially in stack;
   a source electrode and a drain electrode, wherein the source electrode and the drain electrode are arranged in a same layer, and are both located between the first luminescent layer and the second luminescent layer; and
   an insulating layer provided in the same layer as the source electrode and the drain electrode, and located between the source electrode and the drain electrode.

2. The light emitting device according to claim 1, wherein the light emitting device further comprises a first charge-carrier transporting layer and a second charge-carrier transporting layer;
   the first charge-carrier transporting layer is located on one side of the first luminescent layer that is away from the first electrode layer; and
   the second charge-carrier transporting layer is located between the second luminescent layer and the first luminescent layer, and located on one side of the insulating layer that is away from the first luminescent layer.

3. The light emitting device according to claim 2, wherein both of the first charge-carrier transporting layer and the second charge-carrier transporting layer are an electron transporting layer.

4. The light emitting device according to claim 2, wherein both of the first charge-carrier transporting layer and the second charge-carrier transporting layer are a hole transporting layer.

5. The light emitting device according to claim 2, wherein one of the first charge-carrier transporting layer and the second charge-carrier transporting layer is an electron transporting layer, and the other is a hole transporting layer.

6. The light emitting device according to claim 3, wherein the first electrode layer and the second electrode layer are configured to receive electric signals of same polarities, and the first luminescent layer and the second luminescent layer are configured to emit light at the same time.

7. The light emitting device according to claim 6, wherein the first electrode layer and the second electrode layer are electrically connected; and
   the first electrode layer and the second electrode layer are configured to receive a same electric signal.

8. The light emitting device according to claim 5, wherein the first electrode layer and the second electrode layer are configured to receive electric signals of opposite polarities, and the first luminescent layer and the second luminescent layer are configured to emit light at the same time.

9. The light emitting device according to claim 5, wherein the first electrode layer and the second electrode layer are electrically connected; and
   the first electrode layer and the second electrode layer are configured to receive a same electric signal and alternately emit light.

10. The light emitting device according to claim 1, wherein all of surfaces of the source electrode, the drain electrode and the insulating layer that are away from the first electrode layer are located in a same plane.

11. The light emitting device according to claim 1, wherein a material of the insulating layer is a light-transmitting insulating material.

12. The light emitting device according to claim 11, wherein the light-transmitting insulating material comprises any one of or a combination of some of lithium fluoride, zinc oxide and 4,4'-di(9-carbazolyl) biphenyl.

13. The light emitting device according to claim 4, wherein the first electrode layer and the second electrode layer are configured to receive electric signals of same polarities, and the first luminescent layer and the second luminescent layer are configured to emit light at the same time.

14. The light emitting device according to claim 2, wherein all of surfaces of the source electrode, the drain electrode and the insulating layer that are away from the first electrode layer are located in a same plane.

15. The light emitting device according to claim 3, wherein all of surfaces of the source electrode, the drain electrode and the insulating layer that are away from the first electrode layer are located in a same plane.

16. The light emitting device according to claim 4, wherein all of surfaces of the source electrode, the drain electrode and the insulating layer that are away from the first electrode layer are located in a same plane.

17. A light emitting substrate, wherein the light emitting substrate comprises a plurality of the light emitting devices according to claim 1.

18. The light emitting substrate according to claim 17, wherein the light emitting substrate is a backlight substrate; and
  both of an emitted-light color of the first luminescent layer of the light emitting device and an emitted-light color of the second luminescent layer of the light emitting device are a blue color; or
  an emitted-light color of one of the first luminescent layer and the second luminescent layer is a yellow color, and an emitted-light color of the other of the first luminescent layer and the second luminescent layer is a blue color.

19. The light emitting substrate according to claim 17, wherein the light emitting substrate is a displaying substrate;
  the light emitting substrate comprises a plurality of light-emitting-device groups that are arranged in array, and each of the light-emitting-device groups comprises a plurality of light emitting devices with different emitted-light colors; and
  emitted-light colors of the first luminescent layer and the second luminescent layer of a same light emitting device are the same.

20. A controlling method of a light emitting device, applied to control the light emitting device according to claim 1 to emit light, wherein the controlling method comprises:
  supplying a first voltage signal to the source electrode of the light emitting device;
  supplying a second voltage signal to the drain electrode of the light emitting device;
  supplying a third voltage signal to the first electrode layer of the light emitting device, wherein the third voltage signal is configured to control the first luminescent layer of the light emitting device to emit light; and
  supplying a fourth voltage signal to the second electrode layer of the light emitting device, wherein the fourth voltage signal is configured to control the second luminescent layer of the light emitting device to emit light, and the first luminescent layer and the second luminescent layer are configured to be capable of emitting light at the same time or be capable of alternately emitting light.

\* \* \* \* \*